United States Patent [19]

Mockler et al.

[11] Patent Number: 4,668,335
[45] Date of Patent: May 26, 1987

[54] ANTI-CORROSION TREATMENT FOR PATTERNING OF METALLIC LAYERS

[75] Inventors: Kenneth J. Mockler, Cupertino; Richard C. Kittler, Santa Clara; Glenn S. Warner; Howard F. Hsu, both of San Jose, all of Calif.

[73] Assignee: Advanced Micro Devices, Inc., Sunnyvale, Calif.

[21] Appl. No.: 771,386

[22] Filed: Aug. 30, 1985

[51] Int. Cl.⁴ .................................................. B44C 1/22
[52] U.S. Cl. ..................................... 156/643; 156/652; 156/656; 156/657.1; 156/664; 156/665; 430/313; 430/316; 430/318
[58] Field of Search ............... 430/313, 316, 318, 329; 156/643, 665, 652, 656, 659.1, 664

[56] References Cited

U.S. PATENT DOCUMENTS

| | | | |
|---|---|---|---|
| 4,267,012 | 5/1981 | Pierce et al. | 156/643 |
| 4,325,984 | 4/1982 | Galfo et al. | 427/38 |
| 4,547,260 | 10/1985 | Takada et al. | 156/643 |

OTHER PUBLICATIONS

Thompson et al, *Introduction to Microlithography*, American Chemical Society, Washington, D.C., 1983, pp. 243-244.

Harrison et al., The Use of Anti-Reflection Coatings for Photoresist Linewidth Control, National Semiconductor Co., 1983, pp. 1-18.

*Primary Examiner*—John E. Kittle
*Assistant Examiner*—José G. Dees
*Attorney, Agent, or Firm*—J. Vincent Tortolano; Patrick T. King

[57] ABSTRACT

An improved method is provided for defining interconnect patterns in an integrated circuit fabricated on a semiconductor wafer. The improvement comprises the step of immersing the wafer in a weak base solution, prior to etching a titanium-tungsten barrier layer, so as to remove from the wafer chlorides and flourides remaining as a result of a previous step of etching a conductor layer. In a preferred embodiment of the invention, a step of immersing the wafer in a strong acid solution is also performed to remove chlorides from the wafer.

18 Claims, 11 Drawing Figures

ANTI-CORROSION TREATMENT FOR PATTERNING OF METALLIC LAYERS

FIELD OF THE INVENTION

This invention relates to the fabrication of semiconductor integrated circuits and, more particularly, to an anti-corrosion treatment for patterning metal layers in semiconductor integrated circuits.

BACKGROUND OF THE INVENTION

Conventional semiconductor processing requires patterning of an aluminum or aluminum alloy layer to define conductors, referred to as interconnect lines, between various locations on the device. In order to define the interconnects, a photosensitive organic polymer layer referred to as the photoresist layer is applied over the aluminum and selectively hardened by photolithographic techniques. The non-hardened areas are then removed by selective solvents, forming a desired pattern in the photoresist layer. The exposed portions of the aluminum layer are then etched, typically using a liquid etchant or chlorine plasma, to define the interconnect lines. Often, a layer of titanium-tungsten is provided intermediate the aluminum and silicon layers to prevent migration of the aluminum into the silicon.

The titanium-tungsten layer must be patterned correspondingly to the overlying aluminum layer, typically by etching with a liquid oxidant such as hydrogen peroxide. A problem arises, however, due to the fact that chlorides remain on the semiconductor wafer surface as by-products of the plasma aluminum etch process. These chlorides cause the aluminum to be prone to corrosion in air and in chemical environments (e.g., during subsequent etching steps). Corrosion of the aluminum can result in immediate electrical failure of the device or cause long-term reliability problems due to failure of the device after it has been in operation for some time.

For these reasons, it would be desirable to provide a convenient method which would allow completion of the interconnect process through wet etching of the titanium-tungsten layer without corrosion of the aluminum leads.

SUMMARY OF THE INVENTION

It is therefore an object of this invention to provide an improved method for defining interconnect patterns in an integrated circuit fabricated on a semiconductor wafer.

It is a further object of the present invention to provide a method for defining interconnect patterns in an integrated circuit whereby corrosion of the conductor layer is prevented.

An advantage of the present invention is that immediate and long-term electrical failures of integrated circuit devices are reduced.

Another advantage of the present invention is that the photoresist layer and the anti-reflective coating layer, if present, can be removed prior to the final etch in the interconnect definition process. This prevents the underlying device structures, which become exposed to the surface following completion of the final etch, from being damaged by methods used to remove the photoresist and anti-reflective coating.

Specifically, the present invention is directed to an improved method for defining interconnect patterns on an integrated circuit fabricated on a semiconductor wafer. More particularly, in a fabrication method including the conventional steps of etching a conductor layer and subsequently etching a titanium-tungsten barrier layer which lies between a silicon substrate and the conductor layer, the improvement comprises the step of immersing the wafer in a weak base solution prior to the step of etching the titanium-tungsten barrier layer. This acts to remove chlorides and fluorides from the wafer which remain as by-products of the earlier step of etching the conductor layer.

The foregoing and other objects, features and advantages of the invention will be apparent from the following detailed description of the preferred embodiments of the invention when read in conjunction with the accompanying drawings, with like reference numerals representing corresponding parts throughout.

BRIEF DESCRIPTION OF THE DRAWINGS

FIG. 1 is a cross-section of a titanium-tungsten barrier layer formed between a silicon substrate and an aluminum alloy layer;

FIG. 2 is a cross-section showing FIG. 1 after an anti-reflective coating has been formed over the aluminum alloy layer;

FIG. 3 is a cross-section showing FIG. 2 after a photoresist layer has been formed over the anti-reflective coating;

FIG. 4 is a cross-section showing FIG. 3 after the photoresist layer has been patterned to expose a selected area of the anti-reflective coating overlying a selected area of the aluminum alloy layer;

FIG. 5 is a cross-section showing FIG. 4 after the anti-reflective coating has been etched to expose the selected area of the aluminum alloy layer;

FIG. 6 is a cross section showing FIG. 5 after the aluminum alloy layer has been etched to expose a selected portion of the titanium-tungsten barrier layer;

FIG. 7 is a cross section showing FIG. 6 after the wafer has been dipped in a strong acid solution to reduce chloride by-products remaining on the wafer as a result of previously etching the aluminum alloy layer;

FIG. 8 is a cross-section showing FIG. 9 after the wafer has been dipped in a weak base solution to remove chloride and fluoride by-products remaining on the wafer as a result of previous processing steps;

FIG. 9 is a cross-section showing FIG. 8 after the photoresist layer has been removed;

FIG. 10 is a cross-section showing FIG. 9 after the anti-reflective coating has been removed; and FIG. 11 is a cross-section showing FIG. 10 after the titanium-tungsten barrier layer has been etched to complete the definition of the interconnect pattern.

DETAILED DESCRIPTION OF THE PREFERRED EMBODIMENTS

Reference is now made in detail to the specific embodiments of the present invention which illustrate the best mode presently contemplated by the inventors for practicing the invention, the preferred embodiments of which are set forth in the accompanying drawings. The drawings referred to in this description are understood to be not drawn to scale and to illustrate only one portion of an integrated circuit fabricated in accordance with the present invention.

Figure 1:
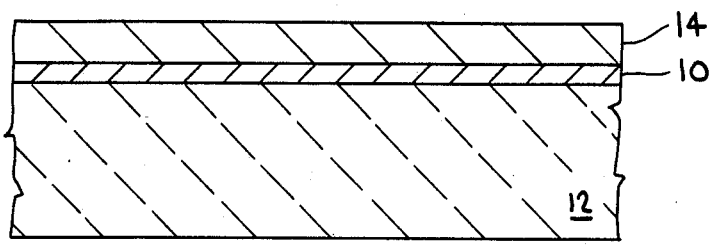
FIGS. 1–11 are cross-sections showing a process sequence in which an interconnect pattern is defined on an integrated circuit fabricated on a semiconductor wafer, and in which, particularly.

Referring now to FIG. 1, a process for defining interconnect patterns on bipolar integrated circuit devices fabricated on a semiconductor wafer typically begins with the forming of a titanium-tungsten barrier layer 10 over a silicon substrate 12. The titanium-tungsten layer 10 is formed using conventional deposition techniques. In accordance with the preferred embodiment of the present invention, the thickness of the titanium-tungsten layer 10 is in the range of 1500–2500 Angstroms.

A conductor layer 14 is next formed over the titanium-tungsten barrier layer 10. The conductor layer 14 may be comprised of aluminum or an aluminum-copper-silicon alloy. In accordance with the preferred embodiment of the present invention, the conductor layer 14 is an aluminum-copper silicon alloy deposited to a thickness in the range of 7000–9000 Angstroms. The titanium-tungsten barrier layer 10 acts to prevent migration of the aluminum species of the conductor alloy into the silicon substrate 12.

Figure 2:
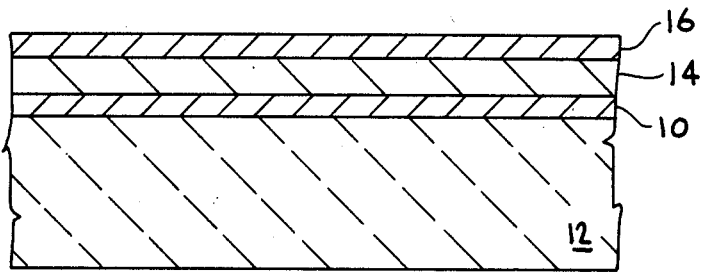

Referring to FIG. 2, the barrier layer-conductor layer 10,12 metallic sandwich may next be covered by an anti-reflective coating 16. While not essential to the present invention, the anti-reflective coating 16 acts to enhance the quality of subsequent photolithographic process steps in the following manner: the exposure of photoresist placed over a reflective surface, such as metal or silicon, produces partial exposure of the photoresist in nondesirable areas due to the diffusive scattering of reflected light and interference effects, particularly if illumination is monochromatic. To minimize this problem, an anti-reflective coating with a known refractive index is placed on the surface below the photoresist to change the amplitude of the reflected light to a minimum at the photoresist/anti-reflective coating interface. The anti-reflective coating may be comprised of such materials as titanium-tungsten, molybdenum disilicide or indium arsenide.

Figure 3:
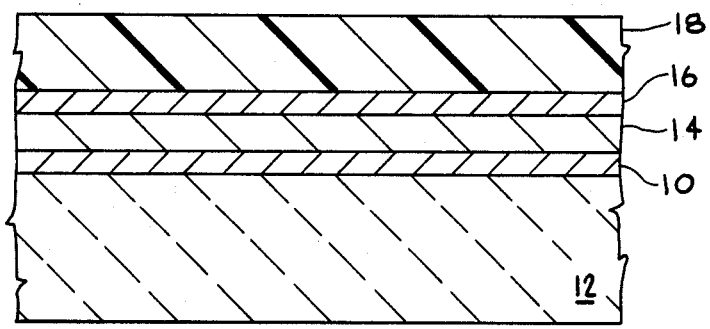

Referring now to FIG. 3, a photoresist layer 18 is next formed over the anti-reflective coating 16. The photoresist layer is formed in a conventional manner by spin-coating the wafer with a photosensitive polymer (photoresist). The photoresist layer 18 is then exposed through a mask (not shown) to define within the photoresist layer 18 an image of a selected portion of the underlying anti-reflective coating 16 and aluminum alloy layer 14 to be etched in subsequent process steps.

Figure 4:
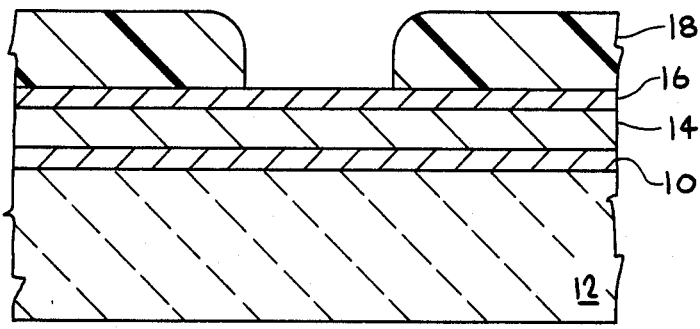

Referring to FIG. 4, the photoresist layer 18 is next developed to expose a selected portion of the underlying anti-reflective coating 16. A high temperature bake is then performed to densify the remaining photoresist layer 18.

Figure 5:
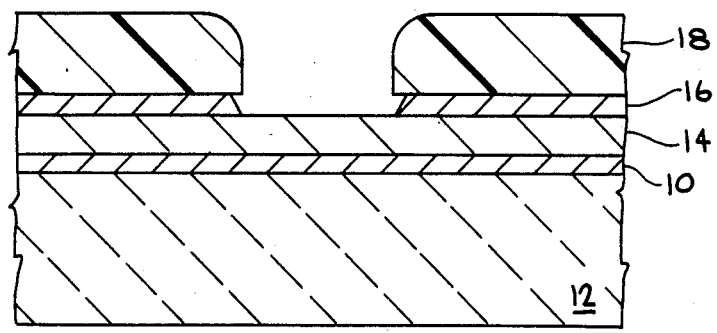
Figure 6:
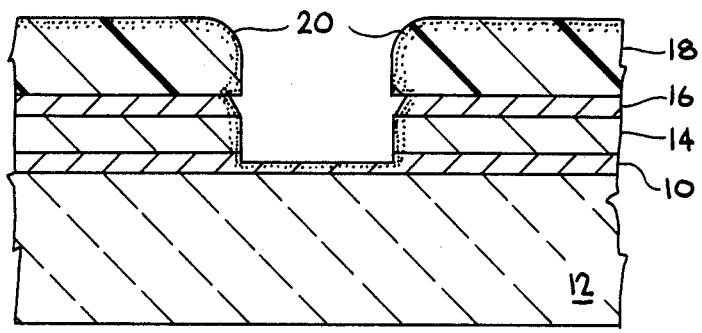

Next, as shown in FIG. 5, the anti-reflective coating 16 is etched to expose a selected portion of the underlying aluminum alloy layer 14. Then, as shown in FIG. 6, the exposed portion of the aluminum alloy layer 14 is etched, thereby exposing a portion of the underlying titanium-tungsten barrier layer 10. Etching of the anti-reflective coating 16 and the aluminum alloy layer 14 is accomplished using a conventional reactive-ion-etch (RIE) or plasma etch technique.

As a result of etching the aluminum alloy layer 14, chloride by-products 20 are left on the exposed surfaces of the various layers over the substrate 12, as shown in FIG. 6. These chloride by-products 20 cause the aluminum alloy layer 14 to be prone to corrosion in air, and in chemical environments such as the hydrogen peroxide used to subsequently etch the titanium-tungsten barrier layer 10.

One method of dealing with this problem is to perform a plasma passivation step after the aluminum layer has been etched. The plasma passivation step is performed using $CF_4$, $SF_6$, $CF_4/O_2$, $CHF_3$ or some other fluorine-based chemistry. The fluorine ions are believed to replace many of the chlorine ions remaining on the substrate as by-products of the aluminum etch process. Replacing the chlorine ions acts to substantially reduce the corrosion rate of the aluminum in air over a process without the passivation step. However, while the corrosion rate in air can be reduced with this process, if the substrate is then immersed in a chemical such as hydrogen peroxide to etch the titanium-tungsten underlayer, the aluminum will corrode.

Figure 7:
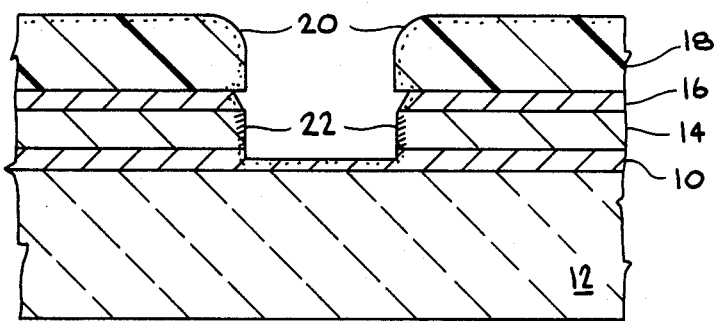

Referring now to FIG. 7, following the plasma passivation step, the wafer in process is dipped in a strong acid solution which acts to remove a significant amount of the chlorides 20 remaining on the wafer as a result of the prior etching of the aluminum alloy layer 14. While any strong acid solution will work to reduce chlorides, in the preferred embodiment of the present invention, nitric acid is used for this purpose. Nitric acid has the advantageous property of reacting with the exposed surface of the aluminum alloy layer 14 to form an aluminum oxide layer 22 which passivates the surface against corrosive chlorides and fluorides.

A further advantage of nitric acid is that the etch rate of aluminum by nitric acid is extremely slow; so slow, in fact, that nitric acid is often shipped in aluminum containers. Hence, the use of nitric acid prevents any undesired erosion of the aluminum alloy layer 14 which would occur if some other chemical, such as phosphoric acid, were used. Other strong acids will also work in place of nitric acid; but only those which do not etch aluminum are to be preferred, such as acetic acid, for example.

In addition to reducing chloride by-products on the wafer surface, dipping the wafer in a strong acid solution also makes it easier to remove the photoresist layer 18 in a subsequent processing step. It should be noted that according to the preferred embodiment of the present invention, the wafer is immersed in the strong acid solution for approximately ten seconds.

Figure 8:
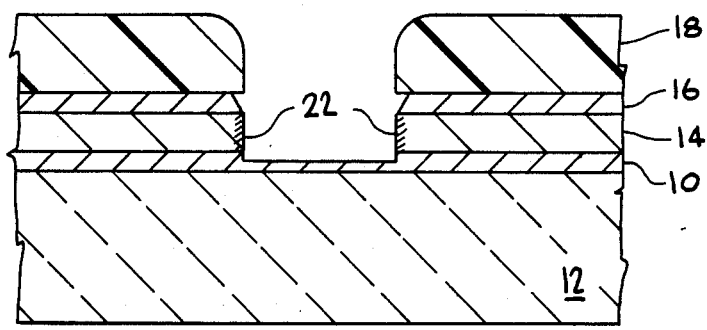

After removing the wafer from the strong acid bath, the wafer is rinsed in water and then immersed for approximately ten seconds in a bath of a weak base solution—in the preferred embodiment of the present invention, this is accomplished using a dilute ammonium hydroxide bath. The purpose of this step is to remove the remaining chloride and fluoride by-products from the surface of the wafer, as illustrated in FIG. 8, so that the aluminum alloy layer 14 will not corrode during the subsequent process step of etching the titanium-tungsten barrier layer 10.

In the preferred embodiment of the present invention, the dilution of the ammonium hydroxide is optimally around 500:1 of a standard 30 percent concentrate of ammonium hydroxide with water, though a range of dilutions will work. A more dilute solution is less effective in removing the chloride and fluoride by-products and a less dilute solution has the undesirable side effect of causing aluminum hydroxide to form on the surface of the titanium-tungsten barrier layer 10, which inhibits subsequent etching of the barrier layer 10. The other weak bases, such as potassium hydroxide or sodium hydroxide, will work in place of ammonium hydroxide;

but ammonium hydroxide has the advantageous property of not leaving behind a salt with imperfect rinsing of the wafer. It should also be noted that the immersion time of ten seconds is not crucial; longer times can be used, but are not necessary, while shorter times are difficult to do with manual operation.

Figure 9:
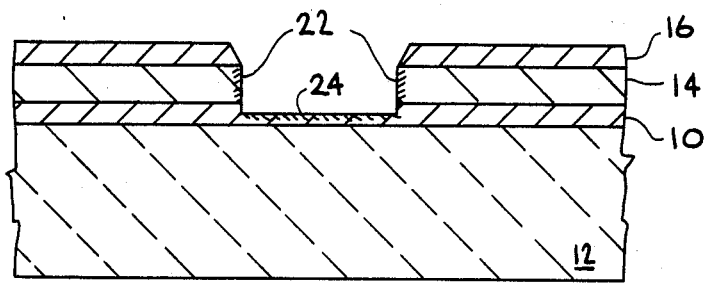

Referring now to FIG. 9, following the immersion of the wafer in a dilution of ammonium hydroxide, the photoresist layer 18 is removed. The photoresist layer 18 is removed using a conventional oxygen-based plasma technique. The anti-reflective coating 16 is possibly oxidized during removal of the photoresist layer 18, as is the titanium-tungsten barrier layer 10, as shown in FIG. 9 as oxide layer 24.

Figure 10:
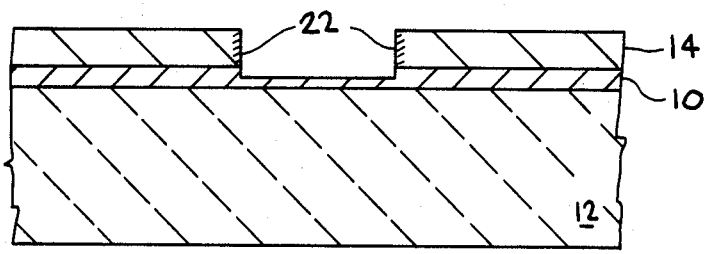

Next, as shown in FIG. 10, the anti-reflective coating 16 and the oxidation on the titanium-tungsten surface are removed. Removal is accomplished using a fluorine-based plasma or chemical process. The oxidation on the surface of the titanium-tungsten barrier layer 10 must be removed, otherwise it would inhibit subsequent wet etching of the barrier layer 10.

Figure 11:
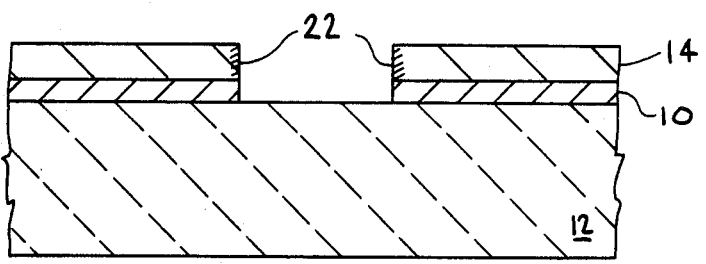

Finally, as shown in FIG. 11, the exposed portion of the titanium-tungsten barrier layer 10 is etched to complete definition of the interconnect pattern on the wafer. In the preferred embodiment of the present invention, the barrier layer 10 is etched in hydrogen peroxide.

The foregoing description of a specific embodiment of the present invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto and their equivalents.

What is claimed is:

1. An improved method for defining interconnect patterns in an integrated circuit fabricated on a semiconductor wafer, said method having a step of etching a conductor layer and a subsequent step of etching a titanium-tungsten barrier layer which lies between a silicon substrate and said conductor layer, the improvement comprising the step of:
   immersing said wafer in a strong acid solution which will not etch the conductor layer, prior to said subsequent step of etching the titanium-tungsten barrier layer, so as to remove chlorides from the wafer; and
   immersing the wafer in a weak base solution, so as to remove from the wafer chlorides and fluorides remaining as a result of said step of etching said conductor layer.

2. The method of claim 1, wherein the step of immersing the wafer in a weak base solution is accomplished by the step of immersing the wafer in ammonium hydroxide.

3. The method of claim 1, wherein the step of immersing the wafer in a strong acid solution is accomplished by the step of immersing the wafer in nitric acid.

4. An improved method for defining interconnect patterns in an integrated circuit fabricated on a semiconductor wafer, said method having steps of forming a photoresist layer over a conductor layer, etching said conductor layer, and a subsequent step of etching a titanium-tungsten barrier layer which lies between a silicon substrate and said conductor layer, the improvement comprising the steps of:
   immersing said wafer in a strong acid solution which will not etch the conductor layer, so as to remove from the wafer and the photoresist layer chlorides remaining as a result of previously etching said conductor layer;
   immersing said wafer in a weak base solution so as to remove from the wafer remaining chlorides and fluorides;
   removing said photoresist layer from said etched conductor layer; and
   etching said titanium-tungsten barrier layer to complete the definition of said interconnect pattern.

5. The method of claim 4 wherein the following step is performed:
   forming an anti-reflective coating layer intermediate said etched conductor layer and said photoresist layer.

6. The method of claim 4 wherein the step of immersing the wafer in a strong acid solution is accomplished by the step of immersing the wafer in nitric acid.

7. The method of claim 4 wherein the step of immersing the wafer in a weak base solution is accomplished by the step of immersing the wafer in ammonium hydroxide.

8. The method of claim 6 wherein the step of immersing the wafer in nitric acid is accomplished by the step of immersing the wafer in nitric acid for approximately ten seconds.

9. The method of claim 7 wherein the step of immersing the wafer in ammonium hydroxide is accomplished by the step of immersing the wafer in a dilution of ammonium hydroxide of approximately 500 to 1 of a 30 percent concentrate of ammonium hydroxide with water.

10. The method of claim 9 wherein the step of immersing the wafer in a dilution of ammonium hydroxide is accomplished by immersing the wafer in a dilution of ammonium hydroxide for approximately ten seconds.

11. The method of claim 4 wherein the step of removing said photoresist from said etched conductor layer is accomplished by the step of removing said photoresist layer by using an oxygen-based plasma.

12. The method of claim 5 wherein the following step is performed:
   removing said anti-reflective coating using a fluorine-based plasma etch.

13. The method of claim 5 wherein the following step is performed:
   removing said anti-reflective coating using a chemical etch.

14. An improved method for defining interconnect patterns in a semiconductor device fabricated on a semiconductor wafer, said semiconductor device having a silicon substrate, said method comprising the steps of:
   forming a titanium-tungsten barrier layer over said silicon substrate;
   forming a conductor layer over said titanium-tungsten barrier layer;
   forming a photoresist layer over said conductor layer;
   optically exposing said photoresist layer to define within said photoresist layer images of said interconnect patterns;

developing said photoresist layer to expose a portion of said conductor layer;

etching said exposed portion of said conductor layer to expose a portion of said titanium-tungsten barrier layer;

plasma passivating said wafer to reduce the corrosion rate of said conductor layer in air;

immersing said wafer in a strong acid solution which will not etch the conductor layer, so as to remove from the wafer and the photoresist layer chlorides remaining as a result of said etching of the conductor layer;

immersing said wafer in a weak base solution so as to remove from the wafer remaining chlorides and fluorides;

removing said photoresist layer from said etched conductor layer; and etching said exposed portion of said titanium-tungsten barrier layer.

15. The method of claim 14 wherein the following step is performed:
forming an anti-reflective coating layer intermediate said conductor layer and said photoresist layer.

16. The method of claim 14 wherein the step of forming a conductor layer over said titanium-tungsten barrier layer is accomplished by the step of forming over said barrier layer a layer of material selected from the group consisting of aluminum and aluminum-copper-silicon alloy.

17. The method of claim 16 wherein the thickness of said layer of material selected from the group consisting of aluminum and aluminum-copper-silicon alloy is in the range of 7000–9000 Angstroms.

18. The method of claim 14 wherein the thickness of said titanium-tungsten barrier layer is in the range of 1500–2500 Angstroms.

* * * * *